(12) United States Patent
Golden et al.

(10) Patent No.: US 7,132,840 B2
(45) Date of Patent: Nov. 7, 2006

(54) METHOD OF ELECTRICAL TESTING

(75) Inventors: James Golden, Afton, MN (US); Wayne Rademacher, Jordon, MN (US); Calvin Lee Schumacher, Elko, MN (US); Philip William Seitzer, Bethlehem, PA (US); Steven V. Stang, Inver Grove Heights, MN (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 11/138,152

(22) Filed: May 26, 2005

(65) Prior Publication Data

US 2006/0022689 A1 Feb. 2, 2006

Related U.S. Application Data

(60) Provisional application No. 60/592,153, filed on Jul. 29, 2004.

(51) Int. Cl.
*G01R 31/02* (2006.01)
*C23C 16/52* (2006.01)
*C23C 20/00* (2006.01)

(52) U.S. Cl. .................................................. 324/754
(58) Field of Classification Search ...................... None
See application file for complete search history.

(56) References Cited

U.S. PATENT DOCUMENTS

| | | | | |
|---|---|---|---|---|
| 3,158,495 A | * | 11/1964 | Peterson et al. ............ | 427/226 |
| 4,120,995 A | * | 10/1978 | Phipps et al. ............ | 427/255.23 |
| 4,583,145 A | * | 4/1986 | Monnich et al. ............ | 427/128 |
| 4,753,094 A | * | 6/1988 | Spears ........................ | 427/11 |
| 4,900,579 A | * | 2/1990 | Lee et al. ..................... | 427/11 |
| 5,589,270 A | * | 12/1996 | Murai et al. ................. | 427/103 |
| 6,541,381 B1 | * | 4/2003 | Molnar ....................... | 438/690 |
| 6,706,473 B1 | * | 3/2004 | Edman et al. ................. | 435/6 |

FOREIGN PATENT DOCUMENTS

JP 09048080 A * 2/1997

OTHER PUBLICATIONS

Caig Laboratories, Material Safety Data Sheet for DeoxIT Power Booster D100L, Nov. 1, 2003.
Caig Laboratories, Material safety Data Sheet for ProGold, DeoxIT & PreservIT, Jan. 2000.
Chemical Electronics Co., Material Safety Data Sheet for Lubricant P54, Mar. 2, 2004.
Nye Lubricants Inc., Product Sheet for Nye Rheolube 362HT, Feb. 7, 2003.

* cited by examiner

*Primary Examiner*—Jermele Hollington

(57) ABSTRACT

A method of electrical testing devices such as integrated circuits that include conductive pads formed on the surface. A material having a desired bulk resistivity and viscosity is applied to either the device or the electrical probe prior to testing. The application of the material has been found to substantially reduce the need for cleaning of the probe.

9 Claims, 1 Drawing Sheet

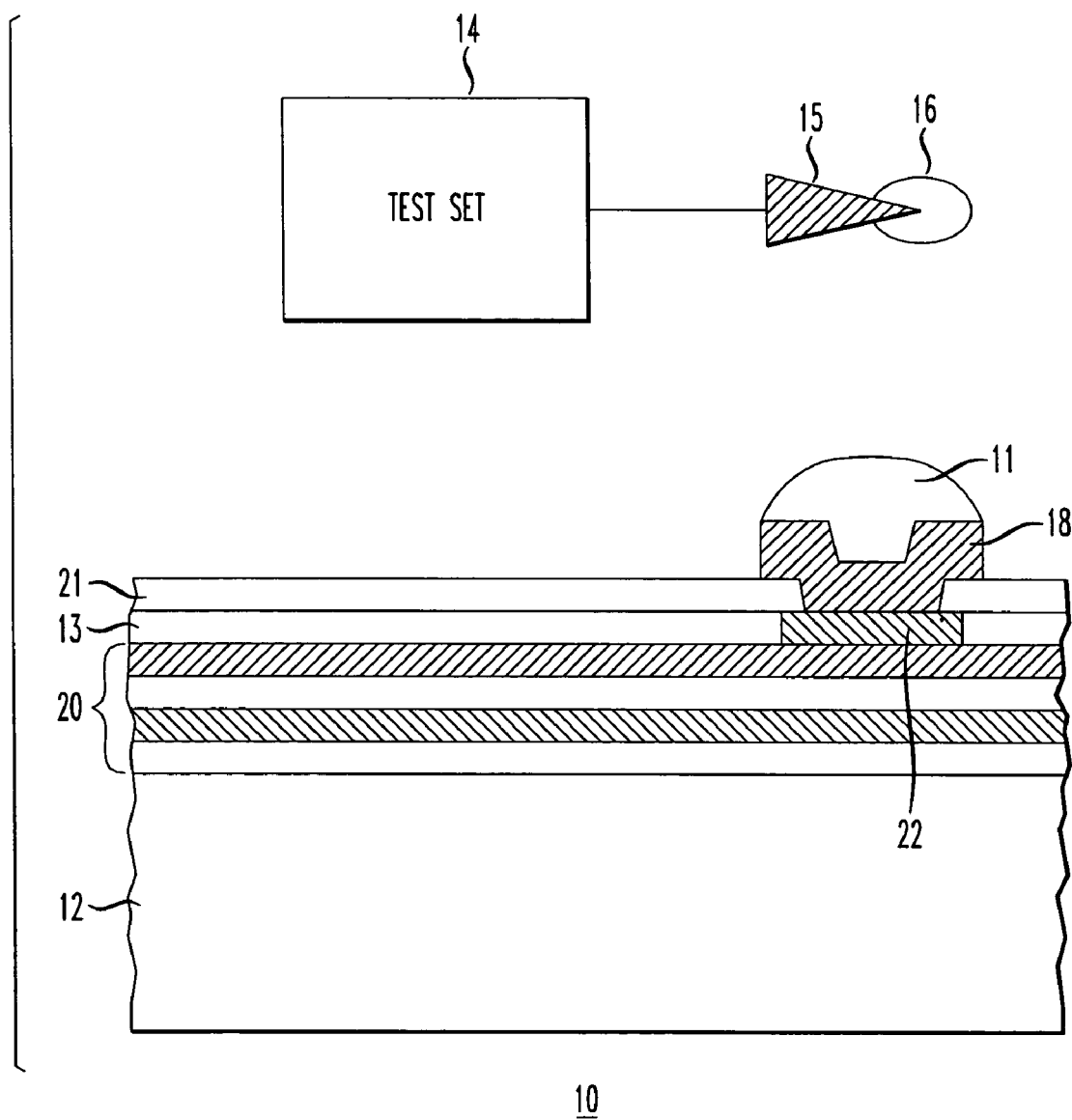

METHOD OF ELECTRICAL TESTING

CROSS REFERENCE TO RELATED APPLICATION

This application claims the benefit of co-pending provisional application No. 60/592,153, filed Jul. 29, 2004.

FIELD OF THE INVENTION

The present invention relates generally to the fabrication of devices and, more particularly, to a method of electrically probing the devices.

BACKGROUND OF THE INVENTION

During the fabrication of semiconductor integrated circuits and other devices, it is often desirable to apply an electrical probe to the contact pads of the chip in order to test the circuit. This probing is preferably done after solder bumps have been formed on the pads in order to prevent damage to the pads that can result in leakage. Normally, after only a few touchdowns, the contact resistance between the probe and the bump increases significantly and is very unstable, resulting in erroneous electrical measurements. A similar problem may exist even without solder when aluminum pads are used, since aluminum oxide tends to build up on the probes.

This contact resistance problem has traditionally been solved, in the case of solder bumps containing lead, by frequent cleaning of the probe tip using an abrasive surface. The probe tips are scrubbed across the surface and the solder build-up is sanded away. This process can be time consuming. Further, when lead-free solder bumps are employed, the cleaning frequency and aggressiveness are increased significantly for the cleaning to be effective. In fact, cleaning is required so often that the test throughput is severely curtailed. Also, the probe card wears out more quickly resulting in a higher cost for the tests.

It is, therefore, desirable to provide a method of electrical testing which does not require frequent cleaning of the test probes.

SUMMARY OF THE INVENTION

To achieve these and other objects, and in view of its purposes, the present invention provides a method of electrically testing with an electrical probe an integrated circuit having a contact pad. A material having a bulk resistivity of at least $1 \times 10^8$ ohm-cm and a viscosity higher than water is formed over the pad or on an electrical probe. The probe is then placed in electrical contact with the pad. In cases where a solder is formed on the pad, the material is formed on the solder or the probe, and the probe is then placed in contact with the solder.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures:

The FIGURE is a cross sectional schematic view of a portion of a semiconductor integrated circuit during one stage of fabrication illustrating features in accordance with an embodiment of the invention.

DETAILED DESCRIPTION OF THE INVENTION

Referring now to the drawing, the FIGURE is a schematic cross sectional view of a portion of an integrated circuit chip, 10, during a testing phase in the fabrication of the circuit. The chip includes the standard topological features such as alternate layers of dielectric and conductive layers, 20, formed over the semiconductor substrate, 12. Planarization layers, 13 and 21, are typically formed over essentially the entire surface of the chip. In this example, the substrate, 12, was silicon, and the planarization layers, 13 and 21, were polyimide and silicon nitride formed by standard techniques such as plasma enhanced chemical vapor deposition. The chip also includes metal areas, e.g., 22, on the surface through which electrically conductive bonding pads, e.g., 18, provide electrical contact to the underlying conductive layers.

A solder bump, 11, is formed on the pad, 18, by standard techniques. In a preferred embodiment, the solder was a lead-free solder which is particularly difficult to use without the present invention. Such solders typically comprise tin, silver, and copper, for example those sold by Flip Chip International under the name LF2. It should be understood that a chip would usually include several pads such as 18 with solder bumps such as 11 formed thereon.

In order to electrically test the chip, 10, a standard test set, 14, was provided, such as that sold by Teradyne under the name A-580 test system. A metal probe, 15, was electrically coupled to the test set and was adapted to provide an electrical connection between the test set and the chip when the probe makes physical contact to the solder 11. Normally, the contact resistance between the probe, 15, and solder bump, 11, would increase and become unstable after only a few touchdowns. It is believed that this is due to the build-up of tin oxide from the solder on the probe In accordance with a feature of the invention, at least the portion of the probe surface which will make contact with the solder is covered with a material, 16. In general, the material, 16, can be any material which is more viscous than water and which prevents the build-up of oxide from the solder on the probe. The material also preferably has a bulk resistivity of at least $1 \times 10^8$ ohm-cm in order to prevent leakage paths from forming between adjacent solder bumps in the event that the material deposits in the area between bumps. Further, the material is preferably a lubricant that does not allow any oxide to build up on the tip, and also improves conductivity by filling in voids on the surface of the probe. In one example, the material was a lubricant sold by Chemical Electronics CO., Ltd. Yamato Factory under the designation Lubricant P54. In another example, the material was a cleaner and lubricant sold by CAIG Laboratories under the designation DeoxIT Power Booster D100L. Further useful materials include a cleaner/lubricant sold by CAIG under the designation ProGold, and a lubricant also sold by CAIG under the designation PreservIT. It is also believed that a further useful material would be a lithium soap thickened, light viscosity synthetic hydrocarbon grease sold by Nye Lubricants under the designation Nye Rheolube 362HT. The material, 16, may be applied to the probe, 15, by dipping the probe into the material immediately prior to probing. Alternatively, the material can be deposited selectively over the solder bumps, 11, or on essentially the entire surface of the chip prior to probing. In any event, it is preferred that the material form a thin coating so that only a few monolayers exist when the probe contacts the bump and pressure is applied for the testing. That way, sufficient current will flow between the probe, 15, and solder bump, 11, in spite of the relatively high bulk resistivity of the material, 16. It is also preferred that the lubricant be water-soluble for easy removal from the chip surface.

As a result of using the material, 16, the need for cleaning the probe tip was essentially eliminated.

Although the invention has been described with reference to exemplary embodiments, it is not limited to those embodiments. For example, a light organic oil may also work in place of the materials specified above. Also, the invention may be applicable where aluminum bonding pads are used without the solder bumps formed thereon. Rather, the appended claims should be construed to include other variants and embodiments of the invention which may be made by those skilled in the art without departing from the true spirit and scope of the present invention.

What is claimed:

1. A method of electrically testing with an electrical probe an integrated circuit having a conductive pad, comprising the steps of applying over the pad or probe a material having a bulk resistivity of at least $1 \times 10^8$ ohm-cm and a viscosity greater than water, and electrically contacting the pad with the probe.

2. The method according to claim 1 wherein solder bumps are formed on the pads prior to contacting the pad with the probe.

3. The method according to claim 1 wherein the material is applied to the probe by dipping the probe into the material.

4. The method according to claim 2 wherein the material is applied selectively to the solder bump.

5. The method according to claim 1 wherein the material is applied over essentially the entire surface of the device.

6. The method according to claim 1 wherein the material is a lubricant.

7. The method according to claim 1 further comprising the step of removing the material after testing.

8. The method according to claim 7 wherein the material is water-soluble.

9. The method according to claim 2 wherein the solder is lead-free.

* * * * *